United States Patent [19]
Ryding

[11] 4,234,797
[45] Nov. 18, 1980

[54] TREATING WORKPIECES WITH BEAMS
[75] Inventor: Geoffrey Ryding, Manchester, Mass.
[73] Assignee: Nova Associates, Inc., Beverly, Mass.
[21] Appl. No.: 41,806
[22] Filed: May 23, 1979
[51] Int. Cl.² ............................................. A61K 27/02
[52] U.S. Cl. ................................ 250/492 B; 250/355; 250/359
[58] Field of Search .................... 250/354, 355, 492 B, 250/358–360

[56] References Cited
U.S. PATENT DOCUMENTS

| 3,689,766 | 9/1972 | Freeman | 250/281 |
|---|---|---|---|
| 3,778,626 | 12/1973 | Robertson | 250/492 |
| 3,993,018 | 11/1976 | Kranik et al. | 118/52 |
| 4,011,449 | 3/1977 | Ko et al. | 250/309 |
| 4,021,675 | 5/1977 | Shifrin | 250/492 A |
| 4,118,630 | 10/1978 | McKenna et al. | 250/492 A |

FOREIGN PATENT DOCUMENTS 1389294  4/1975  United Kingdom .

OTHER PUBLICATIONS

"High Speed Disk Scanner . . ." by Balderes et al., IBM Tech. Discl. Bulletin, vol. 19, No. 3, Aug. 1976, pp. 867, 868.
"The Impact of Ion Implantation . . ." by Dill et al., Solid State Technology, vol. 15, No. 12, Dec. 1972, pp. 27–35.
"On–Line Ion Implantation–" by Hammer IBM Tech. Discl. Bulletin, vol. 18, No. 7, Dec. 1975, pp. 2386, 2387.
"Development–Ion Implanter" by Hicks et al. J. Vac. Sci. Tech., vol. 55, No. 3, Jun. 1978 ( 3 pages).
"Rotating Scan for Ion Implantation" by Robertson, Western Electric Engineering, P.O. Box 900, Princeton, N.J.
"PR–200 Ion Implantation System" by Bird et al., J. Vac. Science Tech., vol. 15, No. 3, Jun. 1978, pp. 1080–1085.
"PR 30 Ion Implantation System" by McCallum et al., J. Vac. Sci. Tech., vol. 15, No. 3, Jun. 1978, pp. 1087–1090.
"Ion Beams . . . Implantation" by Wilson et al., John Wiley Publisher, pp. 446–459.

Primary Examiner—Harold A. Dixon

[57] ABSTRACT

In apparatus for controlling the treatment of a workpiece by a beam emanating from a source, there is translational relative movement in two orthogonal directions between the beam and the workpiece support element, and control of velocity in one (control) direction occurs in response to a detector, mounted behind the support, which periodically samples the beam through a moving slot in the support element. This slot extends over the range of movement in the control direction. An ion implanter is shown in which the support element is a constantly spinning disk the axis of which is translated in the control direction. Another ion implanter is shown in which the support element is a moving belt. A simple control circuit, useful for both embodiments, achieves a uniform ion dosage upon semiconductor substrates at a high production rate despite variations in beam intensity. The detector is not affected by a shower of electrons upon the support that neutralizes charge on the workpieces.

16 Claims, 10 Drawing Figures

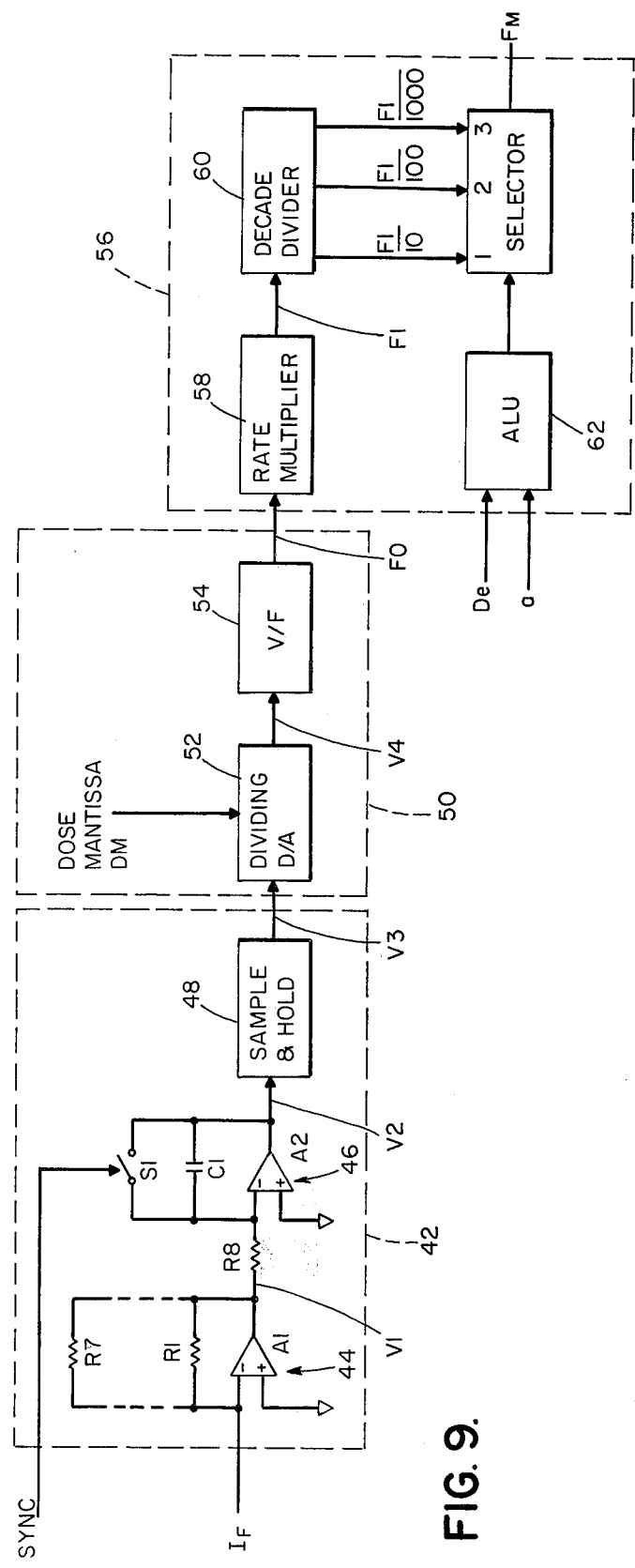
FIG. 9.
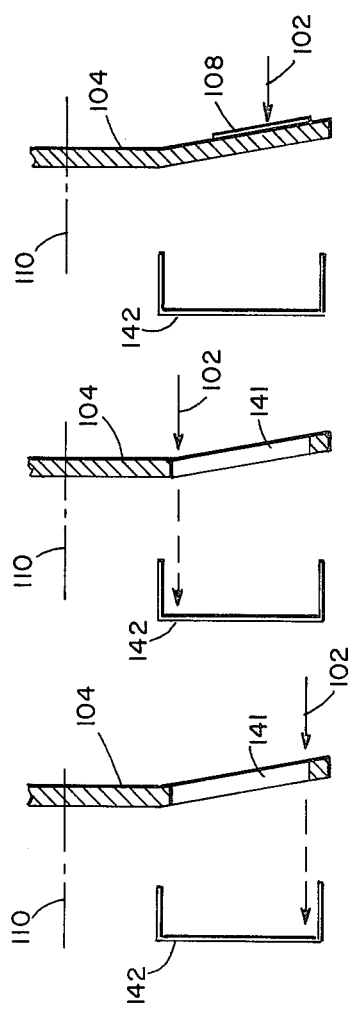
FIG. 10a.
FIG. 10b.
FIG. 10c.

TREATING WORKPIECES WITH BEAMS

FIELD OF THE INVENTION

This invention relates to treating workpieces with beams and particularly to implanting ions in semiconductor wafers.

BACKGROUND OF THE INVENTION

In ion implantation and other processes in which a beam of particles or radiation is directed at a workpiece, the beam must generally be moved across the workpiece in a controlled manner to spread the particle or radiation dosage across the workpiece. In doping semiconductor wafers, a common technique is to move the wafers relative to a fixed beam along two orthogonal directions. The wafers are supported on a moving surface, which moves them at high speed along a scanning direction and at a slower speed along an orthogonal control direction. To achieve uniform doping density, it is conventional to measure the beam intensity, and vary the control speed accordingly, increasing the control speed when the intensity of the beam on the wafers increases and decreasing the speed when it decreases (see e.g. my patent, U.K. Pat. No. 1,389,294).

In the prior art (e.g., Robertson U.S. Pat. No. 3,778,626), beam intensity has been detected by measuring the current flowing to or from the wafer support element. The support element is electrically isolated from the rest of the apparatus, and a current-measuring lead is connected to the element via a slip ring or other sliding electrical contact, all of which complicates the design. Furthermore, this measurement is sensitive to errors from back scatter of secondary charged particles from the surface of the wafers and support element. Ko et al. U.S. Pat. No. 4,011,449 discloses placing a Faraday cage ahead of the support element to capture these scattered charged particles. Current is measured at both the Faraday cage and at the support element. Such prior-art devices suffer from the large capacitance created by measuring current at the support element. The capacitance tends to magnify the noise in the current measurement and generally increases the difficulty of making a precise measurement when small currents (e.g., 10 microamperes) are involved. The devices also cannot easily be used in applications wherein a flood of electrons is directed at the workpieces to neutralize the charge of implanted ions. The electron source must be carefully isolated and contained within the Faraday cage ahead of the support element in order that they not alter the current reading generated by the ion beam. Furthermore, these prior art devices are more difficult to shield from stray electric and magnetic fields.

In another technique Shifrin U.S. Pat. No. 4,021,675 discloses another technique in which a Faraday cage is placed ahead of the wafers and support element. The beam is scanned across an aperture in a plate positioned ahead of the support elements, and beam intensity is measured by Faraday cages located at the edges of the aperture. This has the major disadvantage of requiring scanning of the beam.

When the support element is a spinning disk and the orthogonal control direction is the radial direction along the disk, the prior art (e.g., Robertson) has also shown varying the radial translation speed of the disk in inverse proportion to a measurement of the radial position, to thereby correct for the difference in disk area swept per revolution by the beam as the beam moves radially inward on the disk.

SUMMARY OF THE INVENTION

I have found that beam intensity can be measured more accurately and at lower cost by providing a slot in the support element and positioning a beam detector (e.g., a Faraday cage) behind the support element aligned with the slot as it traverses the beam. The slot extends generally along the orthogonal control direction. The output of the beam detector is used to control the speed with which the support element is moved along the control direction.

This concept is useful to obtain uniform dosage upon wafers in many embodiments, wherever the transmitted beam intensity per unit area of the slot (i.e., the dosage rate through the slot) is essentially the same as the intensity per unit area striking the wafer. By controlling the velocity of scan in the direction of the slot, the control system can maintain a constant intensity per unit area in the slot. In this way a constant dosage level on the wafers can be achieved.

In some preferred embodiments, the beam consists of charged particles and the beam detector is a Faraday cage shielded from low-energy electrons (such as those from an electron gun flooding the surface of the support element) by an electron deflection means; the work is translated along the control direction at a speed that produces a spatially-uniform density of particles and varies according to the expression $$V_Y = 2NP_F/nSD$$

where $V_Y$ is the speed of translation along the control direction, $P_F$ is the measured beam intensity through the slot in terms of particles per unit time, S is the slot width, D is a preselected particle density in terms of particles per unit area, N is the number of full back and forth translation cycles along the second direction, and n is the number of slots; the speed of translation in the scanning direction is at least ten times the speed of translation in the control direction; the beam is stationary and the support element is contained in a moveable vacuum chamber, both of which are moved together along the control direction; the support element carries semiconductor wafers; the slot extends along the control direction beyond the edges of the installed position of the wafers; the Faraday cage is fixed to the vacuum chamber and moves with respect to the beam, the cage extending along the control direction the full length of the slot and thereby receiving the beam passing through the slot for any position of the support element along the control direction.

In certain embodiments the support element is a continuous belt; the scanning direction is along the circumference of the belt; and the control direction is transverse to the circumference of the belt.

In other preferred embodiments, the support element is a spinning disk around which semiconductor wafers are mounted, the scanning direction is the circumferential direction and the control direction is the radial direction. The slot enables accurate detection of the doping rate to which the wafers are exposed, regardless of the radial position of the beam on the disk. As a result it becomes unnecessary to be concerned with measuring and responding to this radial position.

In respect of both preferred embodiments of the ion implanter (spinning disk and moving belt), in one direction because of the high speed of motion, the point where the beam hits the slot and Faraday cage is aligned with the point where the beam immediately thereafter deposits upon the wafers. Hence the intensity detected by the Faraday is a direct representation of the intensity of the ions being implanted. Regulation of the relatively slow speed $V_Y$ (i.e., one tenth or less, in preferred embodiments) of the wafers in the orthogonal control direction dependent upon this detected current then enables an increase in the rate that an area of the wafer is moved if the detected current rises, or a decrease in that rate if the detected current falls, thereby providing uniform doping across the area of the wafers.

PREFERRED EMBODIMENTS

The structure and operation of preferred embodiments of the invention will now be described, after first briefly describing the drawings.

DRAWINGS

FIG. 9 is a schematic and block diagram of the control electronics.

Figure 3:
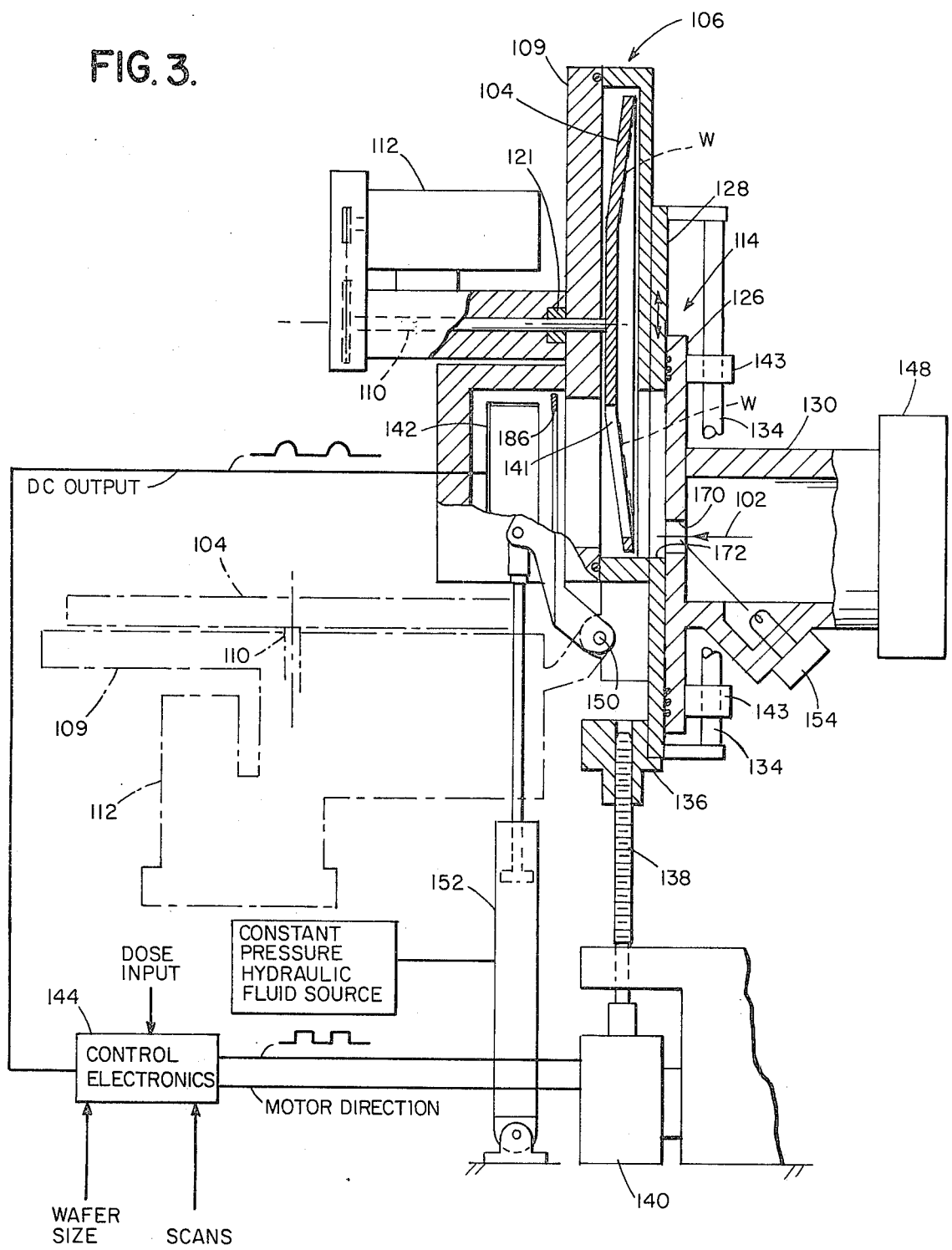
FIG. 3 is a somewhat diagrammatic, cross-sectional view of a most preferred embodiment in which wafers are supported on a rotating disk.

FIGS. 10a, 10b, and 10c are diagrammatic views of the disk and Faraday cage of FIG. 3, illustrating the relative positions of the beam, disk, and cage at three different times during operation.

STRUCTURE

Figure 1:
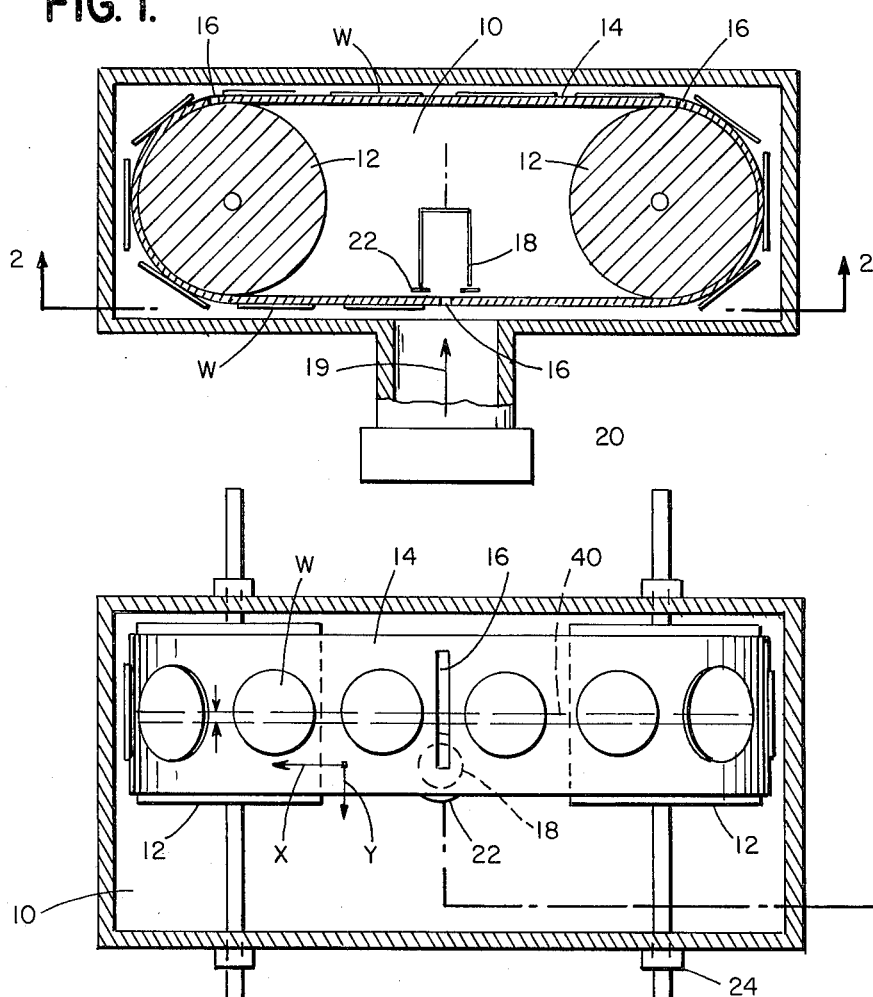
FIG. 1 is a diagrammatic, cross-sectional view of a preferred embodiment in which wafers are supported on a continuous belt.

Referring to FIG. 1, there is shown a vacuum chamber 10 inside of which are two drums 12. Across the drums is stretched a belt 14 carrying wafers W. The belt is made of conductive material such as a stainless steel band (opaque to the beam), and includes three, tranverse slots 16 equally separated along its length. Beneath the belt there is located a cylindrical, stationary Faraday cage 18. A beam of positive ions is directed at the belt and wafers through a vacuum valve 20 from a stationary source (not shown). Only ions passing through slots 16 reach the Faraday cage (the cage is axially aligned with the beam). A bias voltage is applied to entrance plate 22 in front of the Faraday cage so as to stop electrons from entering or leaving the Faraday cage. An electron gun delivers a diffuse and controlled beam of electrons onto the belt so as to prevent a build up of charge on the wafers.

Figure 2:
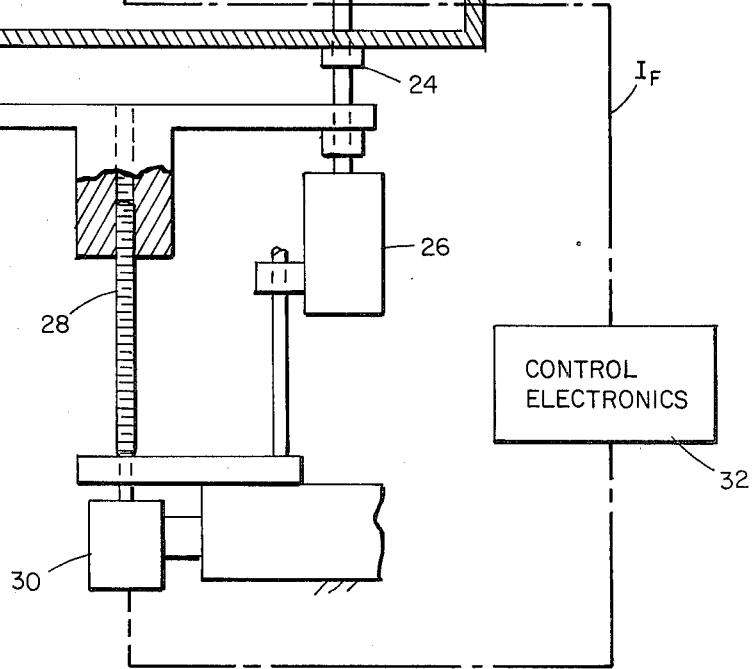
FIG. 2 is a cross-sectional view at 2—2 of FIG. 1.

In FIG. 2 drive mechanisms are shown for translating the belt with respect to the stationary ion beam. The Faraday cage 18 is shown in dotted profile beneath the belt. One of the drums 12 is connective via seal 24 to a drive motor 26, which drives the belt at a constant velocity in the longitudinal X direction. A lead screw 28 and stepping motor 30 move the belt in the transverse Y direction. The stepping motor is driven by a signal derived from the Faraday cage 18 which measures the current passing through the slots as they pass the cage. This measured current takes the form of a train of pulses, one pulse for each slot passage. The pulses are processed by control electronics 32, which in turn generates another pulse train that causes stepping motor 30 to rotate lead screw 28 and thereby translate the belt in the Y direction. Preferably, the stepping motor translates the belt at a transverse velocity $V_Y$ that is proportional to the current $I_F$ measured by the Faraday cage. This assures a uniform dosage of ions across the wafers.

The relationship between $I_F$, $V_F$, and the desired ion dosage can be developed by considering the doping level $\Delta D$ received in a small element 40 of vertical height h. The time t taken for stepping motor 30 to shift the belt this small distance is given by $t = h/V_Y$. The dosage $\Delta D$ (ions/cm$^2$) received in the element is therefore equal to the product of beam current $I_B$ (coulombs/sec) and time t (sec) divided by the area of the element and by the charge q of an ion particle (coulombs/particle), $$\Delta D = \frac{I_B t}{qxh} = \frac{I_B(h/V_y)}{qxh} = \frac{I_B}{qxV_y} \tag{1}$$

where x is the circumferential length of the belt. After N back-and-forth transverse cycles of the belt, the total dosage is $$D = 2N \cdot \Delta D = \frac{2NI_B}{qxV_y} \tag{2}$$

Now the current $I_F$ measured by Faraday cage 18 is related to the total beam current by the expression $$I_F = \frac{nSI_B}{x} \tag{3}$$

where n is the number of slots and S is the width of each slot. Solving this expression for $I_B$ and substituting the result in the above expression for the ion dosage D gives $$D = \frac{2N}{qxV_Y} \cdot \frac{xI_F}{nS} = \frac{2NI_F}{qnSV_Y} \tag{4}$$

For a constant dosage D across the wafers, $V_Y$ must thus be varied according to the expression $$V_Y = \frac{2NI_F}{qSnD} \tag{5}$$

This expression can be generalized by replacing $I_F/q$ with $P_F$, the number of particles per second received by the Faraday.

$$V_y = \frac{2NP_F}{SnD} \tag{6}$$

This relationship between $V_Y$, $P_F$, and D is implemented by the electronics linking Faraday cage 18 with stepping motor 30.

Drive motor 26 consists of a DC motor and tachometer servo system which is adjusted so that the longitudinal velocity $V_X$ of the belt is held at a constant value of about 80 in/sec. Stepping motor 30 and lead screw 28 provide a transverse movement d of $2.54 \times 10^{-3}$ cm for each pulse received by the motor. Thus the transverse velocity of the belt is:

$$V_Y = F_M d = (2.54 \times 10^{-3}) F_M \qquad (7)$$

where $F_M$ is the motor stepping frequency.

In this preferred embodiment the belt contains three slots each 0.41 cm wide. Substituting these values (and the value for q) in equation 5 we have $$V_Y = \frac{(6.24 \times 10^{18}) 2 N I_F}{3(0.41) D} \qquad (8)$$

and using equation 7, we get $$F_M = (4 \times 10^{21}) \frac{N I_F}{D} \qquad (9)$$

Turning to FIG. 9, there is shown the electronic control system for implementing equation 9.

Faraday cage current $I_F$ is applied to a current-to-voltage converter 42, which consists of an electrometer 44, an integrator 46, and a sample and hold circuit 48. All current $I_F$ received by the Faraday cage is fed into a current-summing amplifier $A_1$. The gain of this amplifier is selected by the choice of current-range resistors $R_1$ through $R_7$. The output voltage $V_1$ of the amplifier is $$V_1 = -8 I_F 10^{-a} \qquad (10)$$

where a is set by the resistors $R_1$ and $R_7$. Voltage $V_1$ is thus representative of the instantaneous current measured by the Faraday cage.

Integrator 46 is used to provide a voltage $V_2$ that is proportional to the total charge contained in each ion-beam pulse transmitted through slots 16 of the belt.

A synchronization signal generated by an optical sensor located inside chamber 10 detects each slot 16 approximately 3.12 msec before it passes through the beam and provides a signal gate of 6.25 msec duration to open switch $S_1$ just before each beam pulse arrives. Opening switch $S_1$ initiates integration, allowing capacitor $C_1$ to store a charge. $C_1$ has a value of 0.01 microfarads, and $R_8$ has a value of 150 K ohms.

Sample-and-hold circuit 48 includes amplifiers that determine the peak value of the integrator output $V_2$ for each slot passage. One amplifier stores the value of $V_2$ approximately $10\mu$ sec after $S_1$ opens, and the second stores the value of $V_2$ approximately $10\mu$ sec before $S_1$ closes. The difference between the two stored values is used to generate output signal $V_3$, which is proportional to the number of ions passing through slot 16. Substituting these values and combining with the expression for $V_1$, we have $$V_3 = \frac{4 I_F}{10^{(-4+a)}} \qquad (11)$$

A voltage-to-frequency converter 50 is the next processing unit. The desired dosage D can be expressed logarithmically as a mantissa $D_M$ and exponent $D_E$ according to the expression $$D = D_M 10^{D_E} \qquad (12)$$

Voltage $V_3$ is divided by mantissa $D_M$ at a dividing D/A converter 52, giving $$V_4 = V_3 / D_M \qquad (13)$$

$V_3$ is converted to a serial pulse train using a voltage-to-frequency converter with a transfer characteristic of $10^5$ Hz per volt. Output $F_o$ is a pulse train of frequency $$F_o = 10^5 V_3 / D_M \qquad (14)$$

Pulse train $F_o$ is fed into digital control unit 56. The pulses first enter rate multiplier 58 which is responsive to dial 60 for setting the number of transverse cycles N of the belt. The output $F_1$ has a frequency given by $$F_1 = \frac{F_o N}{100} \qquad (15)$$

Pulses $F_1$ then pass into decade divider 60, which provides three alternative output pulse trains with frequencies of $F_1/10$, $F_1/100$ and $F_1/1000$. Arithmetic logic unit 62 with digital inputs for the dosage exponent $D_E$ and beam current range a (derived from the selected current-range resistor $R_1$ to $R_7$) is used to select the output of the decade divider in such a way that the final output pulse train has a frequency $F_M$ given by $$F_M = \frac{N(10^{14})}{10^{(D_E - a)}} F_o \qquad (16)$$

Combining equations 11, 14, and 16 gives $$F_M = \frac{4 I_F}{10^{(-4+a)}} \cdot \frac{10^5}{D_M} \cdot \frac{N(10^{14})}{10^{(D_E - a)}} \qquad (17)$$

Simplifying gives $$F_M = 4 \times 10^{21} \frac{N I_F}{D} \qquad (18)$$

which is identical to equation 9, the desired relationship. Operator inputs to the electronics include the desired dosage D, wafer size, number of disk scans, and current range. Dosage and number of scans are entered using digital thumb wheel switches on the control panel and are typically adjusted from 1 to 100.

Figure 4:
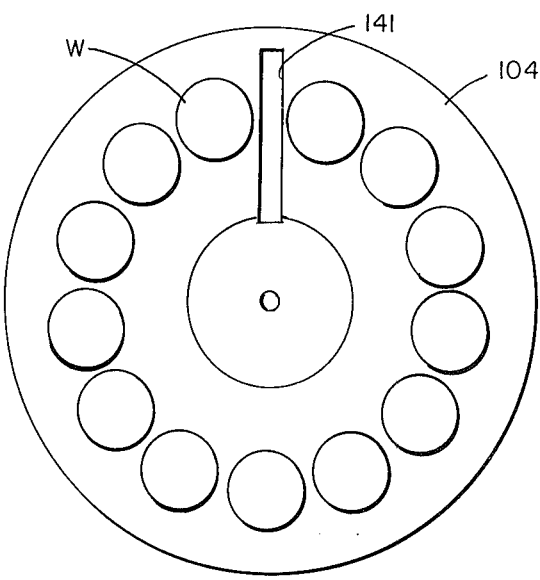
FIG. 4 is a cross-sectional view at 4—4 of FIG. 3, showing the disk and supported wafers.
Figure 4A:
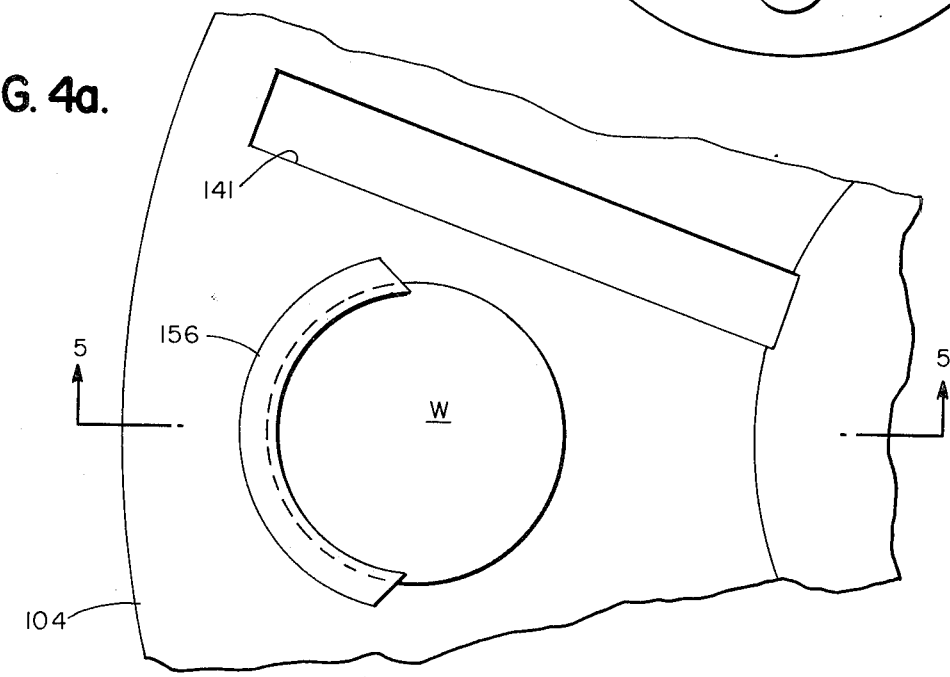
FIG. 4a is an enlarged view of a portion of FIG. 4.
Figure 5:
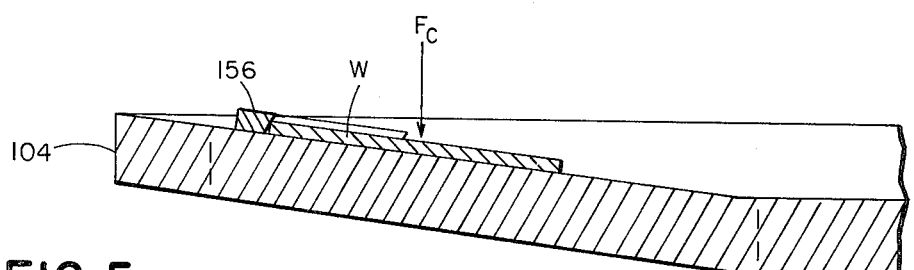
FIG. 5 is a cross-sectional view at 5—5 of FIG. 4a, showing the dish-shape of the disk and the inclination of the wafers.
Figure 6:
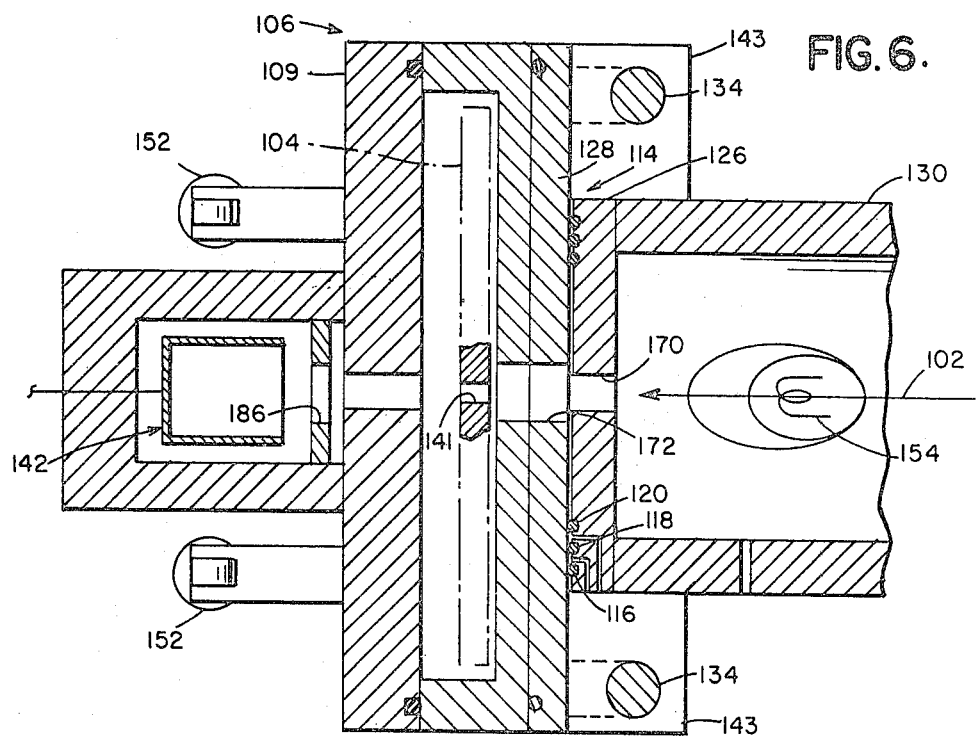
FIG. 6 is a cross-sectional view at 6—6 of FIG. 3.
Figure 8:
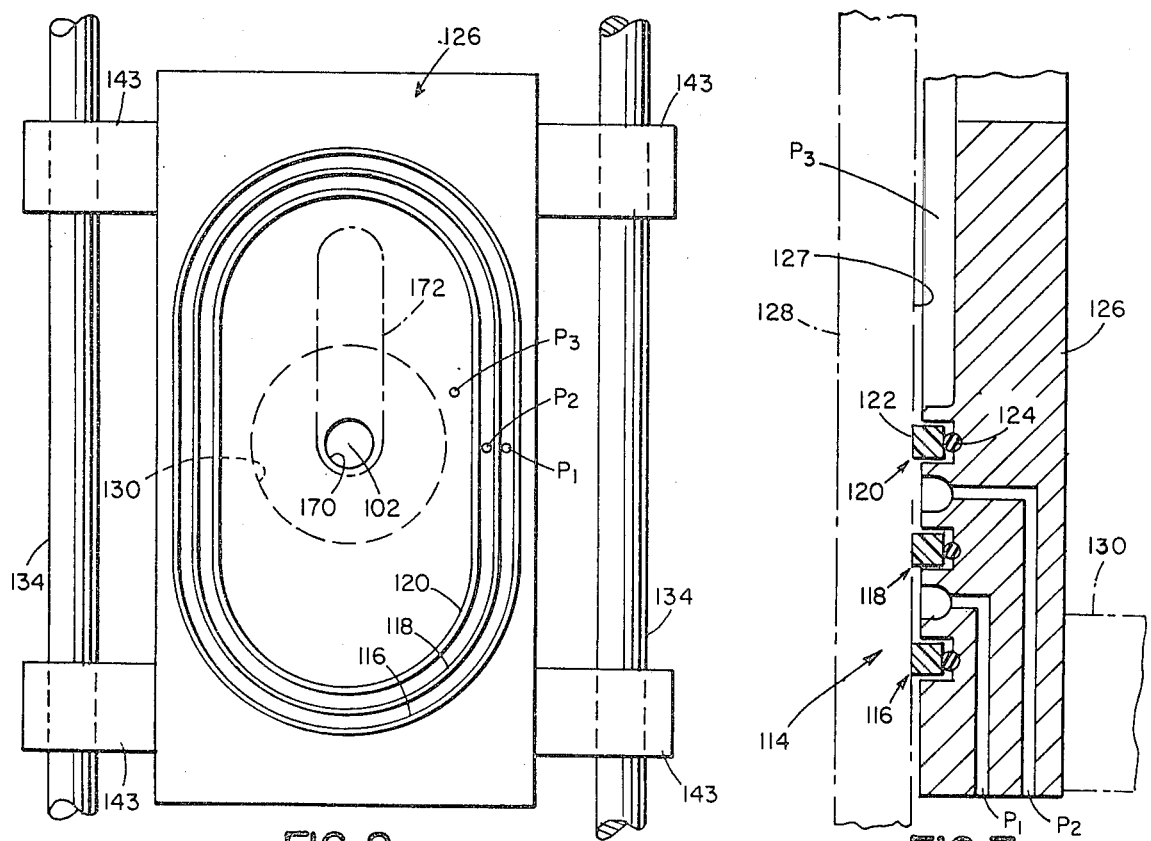
FIG. 8 is a cross-sectional view at 8—8 of FIG. 3, showing the seal plate.
Figure 7:
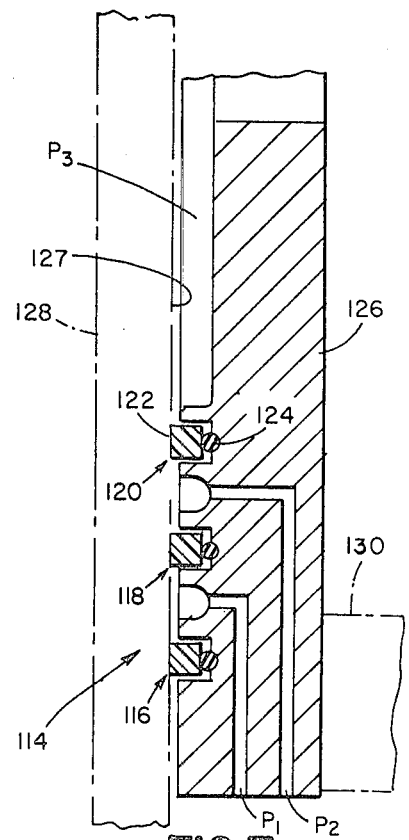
FIG. 7 is an enlargement of a portion of FIG. 6, showing vacuum seals.

Referring to FIGS. 3-8 there is shown another and most-preferred embodiment of the invention. Wafers W (FIGS. 4, 4a, 5) are mounted on the surface of a spinning disk 104, which rotates at approximately 800 rpm. The disk is contained in vacuum chamber 106, (FIG. 3), and is approximately 25 inches in diameter and ¾ inch thick. Chamber 106 is only slightly larger than the disk so as to minimize evacuated volume, the chamber being approximately 25½ inches in diameter and 1 and ½ inches thick. Eighteen three-inch-diameter wafers W are mounted on the disk in a single annular layer. Alternatively, thirteen 4" wafers could replace the eighteen smaller ones. The disk is supported on a spindle 110, which passes through the wall of the vacuum chamber 106. In order to effect a high vacuum seal around this spindle, well-know ferrofluidic seals 121 are used. The disk is driven by a DC servo-system 112, with the velocity of rotation held constant to better than 0.5%. The second axis of motion enables the entire disk chamber 106 to be moved laterally so as to move the stationary beam radially with respect to the disk. A sliding high-vacuum seal 114 permits this lateral motion (FIGS. 6 to 8). The seal consists of fixed concentric sealing rings 116, 118, 120 in fixed plate 126 bearing against moving slide plate 128. The seals have a high-wear-resistance ring 122 (high-density and high-molecular weight polyethylene) backed by an O-ring 124 of soft-durometer buna, which provides the necessary sealing forces. Although from a vacuum requirement viewpoint only one seal is required, in practice three successive seals are provided so that the individual seals do not need to undergo full atmospheric to high-vacuum differential pressure. It is thus possible by the use of between-seal pumping to achieve adequate sealing across each seal while also using relatively low compression forces on the seal, thereby reducing frictional resistance to lateral motion and improving wear and vacuum reliability. In order to further reduce friction, surface 127 of slide plate 128, against which the seals slide, is hardened and polished (hard anodized coat of aluminum infused with Teflon, the Nituff process of Nimet Industries). The between-seal pumping is provided by conventional rotary vane, two-stage vacuum pumps which have oil lubrication. Pressure $P_1$ (FIG. 8) in the region between seals 116 and 118 is typically 1 torr. Pressure $P_2$ in the region between seal 118 and 120 is typically $5 \times 10^{-2}$ torr. Pressure $P_3$ in the chamber is typically $1 \times 10^{-6}$ torr.

Chamber 106 is supported by a linear bearing system and a linear drive system, which provide the desired lateral motion of the chamber and holds the chamber away from the slide plate. The linear bearing system includes two stationary Thompson linear bearings 143 through which slide circular shafts 134, attached to the moving chamber 106. The chamber is moved laterally by stepping motor 140, which drives lead screw 138, threaded in nut 136 attached to the chamber. Beam current striking disk 104 is measured by a Faraday cage 142 positioned on the back side of the disk. A slot 141 is provided in the disk at a suitable location between the wafers from near the outer edge of the disk to the innermost radial position at which the beam strikes the disc. As the disk spins, a sample of the beam passes through the disk once every revolution, and strikes the Faraday cage 142. The samples of beam current measured during each disk revolution are fed to control electronics 144, which are identical to the electronics shown in FIG. 9 and which implement equation 5. The control system moves the spinning disk through the stationary beam at a speed proportional to the detected beam current and inversely proportional to the desired ion dosage.

Disk 104 is constructed of aluminum, to provide good thermal conductivity and relatively good inertness to contamination of the semiconductor wafers. Aluminum also has a reasonably good heat capacity and it provides adequate rigidity for the high-speed rotating disk.

The disk 104 is dish-shaped (FIG. 5) and has an angle of from 6° to 12°, preferably 7°, in the region at which the wafers are mounted. This slight angle of incidence of the wafers to the beam and to the axis of rotation accomplishes two things. As is well known, the tilt prevents channeling of the ions in the silicon structure. It also provides a component of centrifugal force $F_C$ to keep the wafers firmly seated on the disk. The centrifugal force component is also important in promoting good thermal contact between the wafer and the disk even if other clamping means are provided. Retaining rims 156 located on the outer edge of the disk keep the wafers from sliding off the disk. The retaining rim is comprised of an arc of approximately 120°. The disks also provide registration of the wafers on the disk. For clamping purposes this arc could be extended in whole, or as parts to 360°. Heat transfer from the wafer to the disk must not be impeded in order for the thermal energy created by the ion beam to be transferred to the wafers thereby keeping the total temperature rise of the disk during implantation less than about 100° C. Beam 102 is generated by a source (not shown) and passes through vacuum gate valve 148, cylinder 130, circular hole 170 in plate 126, slot 172 in slide plate 128, and into chamber 106. Electron source 154 provides a shower of electrons to neutralize the charge of the ions being deposited on the wafers.

OPERATION

In operation of either preferred embodiment, the disk chamber is opened to exchange wafers by closing a vacuum gate valve 148 (or 20) to seal off the evacuated ion beam generator, venting the chamber to atmospheric pressure, and opening the chamber.

In the embodiment of FIG. 3, the chamber cover 109, to which the disk 104, spindle 110, and drive motor 112 are attached, is rotatably supported on hinges 150. The cover is rotated 90° by cylinders 152 to the position shown in phantom lines, and a new disk with new wafers is substituted for the existing one. The cover is then restored to its normal closed position, the chamber is evacuated, and gate valve 148 is opened to connect the high-vacuum pumping system of the beam generator (not shown). At this time the rotary motion of the disk is initiated and the DC servo-system is used to bring the rotary velocity of the disk up to the fixed and constant operating velocity required for implantation. At this time the radial position of the disk is such that the ion beam strikes the disk at a radial position outside the location of any wafers. The operator now selects the desired ion dosage, the wafer size, and the required number of scans, and gives a start signal to the electronics to initiate lateral motion of the chamber and disk. To assure that the initial position of the beam 102 is at the extreme outer radial edge of the disk, outside of the location of the wafers, a limit switch (not shown) on the drive carriage assembly is checked by the digital control before initiating each implant. Once the implant is started, the entire disk chamber is moved laterally, with the disk moving through the beam the prescribed number of scans and at a velocity consistent with the measured beam intensity $I_F$ and the required dosage D. During this scanning motion the cylinders 152 previously used to close the cover 109, now are furnished with hydraulic fluid by a constant pressure source and serve the purpose of bearing the weight of the disk-chamber assembly throughout its range of vertical travel.

Typically the scanning process may take anywhere from 1 to 60 minutes. On completion of the traversal of the disk and after it is determined that the disk has returned to initiation position with the beam located at the outer edge of the disk, the implantation is complete, and the sequence for closing the gate valve 148, venting the chamber 106, and reloading the disk spindle is initiated again.

Slot 141 in disk 104 extends inward from just inside the outer circumference of the disk (12½ inch radius). The outermost edge of the wafers is 11½ inches, which provides room for the beam to be initially completely outside the wafers. This allows the beam to have begun its controlled inward velocity before reaching the wafers. The slot is about 8 inches long, allowing for a full 7 inches of travel of the center of the beam.

During implantation, beam intensity is coarsely regulated so as not to vary greater than about 5%. Fine regulation is not necessary, as this effect is achieved by varying the disk speed $V_Y$.

All components have been designed to give a dosage accuracy of better than 1%. The lateral velocity has been limited so that it does not exceed maximum velocity of 1.0 inch per second. This means that the lateral distance between two successive passes of the beam will not exceed approximately 2 mm. As the beam 102 is typically on the order of 2 cm in diameter, this constraint on lateral velocity ensures excellent overlapping characteristics of the beam during the implantation process. In the second described embodiment, the disk has a single sampling slot, and, as the disk is rotating at approximately 800 rpm, the period between successive beam samples is about 75 m sec. This sampling rate is sufficient to achieve an overall dosage accuracy and uniformity of better than 1%.

The Faraday cage 142 (which moves with the chamber and disk center) is elongated so that the total beam transmitted by the slot is at all times collected in the Faraday cage independent of the lateral position of the slot with respect to the beam. This is illustrated by FIGS. 10a and 10b, which show the two extreme relative positions of the beam 102 and cage 142. FIG. 10c illustrates the beam impinging on a wafer and not passing through the slot. The Faraday cage also includes a suppression system for preventing low-energy electrons (from source 154 and elsewhere) from reaching the Faraday cage. The suppression is provided by electron deflecting electrode 186 placed between the disk and the Faraday cage. The electrode is biased negatively with respect to the electron gun 154. In this way, electrons, which are typically of low energy not exceeding 200 ev, will be unable to penetrate the potential barrier formed by the negative electrode. The ions, on the other hand, typically have energies of 10,000 ev or more and thus pass through this barrier to the Faraday cage. In FIG. 9 the Faraday cage 142 is supported on the inside of the housing on insulated standoffs (not shown).

OTHER EMBODIMENTS

Other embodiments of the invention are within the scope of the following claims. For example, the slot width could be varied to achieve variations in dosage (e.g., doubling the slot width over a region would halve the dosage in that region); different numbers of slots could be used; the Faraday cage could remain fixed with respect to the beam, allowing it to be of smaller size; other types of beams (e.g., electron, ions and molecular beams and laser beams) could replace the ion beam, with appropriate detectors being substituted for the Faraday cage (e.g. a photon detector for a laser beam).

The support for the wafers need not be translated. Instead the beam can be scanned side-ways to same effect.

What is claimed is:

1. In apparatus for treating a workpiece by directing a beam at the workpiece, said apparatus being of the type including a moving support element for carrying said workpiece in a scanning direction, second means for providing relative translation between said support surface and said beam in a control direction generally orthogonal to said scanning direction, measuring means for measuring the intensity of said beam, control means for varying the speed of translation in said control direction, the improvement wherein said support surface has a slot extending generally along said control direction, said beam measuring means comprises means positioned behind said support element for measuring the intensity of said beam travelling through said slot, and said control means comprises means for varying the speed of translation in said control direction in dependent response to said measured beam intensity travelling through said slot.

2. The apparatus of claim 1 wherein said beam consists of particles and said control means further comprises means responsive to said beam measuring means for providing a preselected spatially uniform particle density across said workpiece by translating along said control direction at a speed that varies according to the expression $$V_Y = 2NP_F/nSD$$

where $V_Y$ is said speed of translation along said second direction, $P_F$ is said measured beam intensity through said slot in terms of particles per unit time, S is said slot width, D is a preselected particle density in terms of particles per unit area, N is the number of full back and forth translation cycles along said second direction, and n is the number of slots.

3. The apparatus of claim 1 wherein the speed of translation along said scanning direction is at least ten times the speed of translation along said control direction.

4. The apparatus of claim 1 wherein said beam consists of charged particles and said beam measuring means comprises a Faraday cage positioned behind said slot.

5. The apparatus of claim 4 wherein said charged particles are positively-charged ions, said workpiece comprises a plurality of semiconductor wafers on which said ions are implanted, and said slot extends beyond the edges of the installed positions of said wafers, whereby said beam can be moved with respect to said slot fully across said wafers while being controlled by measurement of the beam passing through said slot.

6. The apparatus of claim 5 wherein said Faraday cage is mounted for movement relative to said beam in said control direction with said support element and said cage extends along said control direction the full length of said slot, whereby said beam is measured by said cage for any position in which said beam passes through said slot.

7. The apparatus of claim 5 further comprising an electron gun in front of said support element arranged to flood said wafers with electrons to neutralize the charge of said ions.

8. The apparatus of claim 7 wherein said Faraday cage comprises electron deflection means for preventing said electrons from said electron gun from entering said cage after passing through said slot.

9. The apparatus of claim 5 wherein said beam is stationary and said apparatus further comprises a moveable vacuum chamber in which said support element is contained, said chamber and support element being moved together with respect to said beam along said control direction.

10. The apparatus of claim 1, 2, 3, 4 or 9 wherein said support element is a disk, said scanning direction is the circumferential direction on said disk, and said control direction is the radial direction on said disk.

11. The apparatus of claim 10 wherein said disk is adapted to rotate at speeds of the order of 800 rpm.

12. The apparatus of claim 10 wherein said disk has a single said slot.

13. The apparatus of claim 1, 2, 3 or 4 wherein said support element is a continuous belt, said scanning direction is along the circumference of said belt, and said control direction is along the transverse dimension of said belt.

14. The apparatus of claim 2 wherein said support element is a continuous belt and $V_Y$ is along the transverse dimension of said belt.

15. The apparatus of claim 2 wherein said support element is a disk and $V_Y$ is along the radial direction on said disk.

16. In apparatus for treating a workpiece by directing a beam at the workpiece, said apparatus being of the type including a moving support element for carrying said workpiece, first means for translating said support element in a scanning direction, second means for translating said support surface in a control direction generally orthogonal to said scanning direction, measuring means for measuring the intensity of said beam, control means for varying the speed of translation in said control direction, the improvement wherein said support surface has a slot extending generally along said control direction, said beam measuring means comprises means positioned behind said support element for measuring the intensity of said beam travelling through said slot, and said control means comprises means for varying the speed of translation in said control direction in dependent response to said measured beam intensity travelling through said slot.

* * * * *

UNITED STATES PATENT AND TRADEMARK OFFICE
CERTIFICATE OF CORRECTION

PATENT NO. : 4,234,797
DATED : November 18, 1980
INVENTOR(S) : Geoffrey Ryding

It is certified that error appears in the above-identified patent and that said Letters Patent are hereby corrected as shown below:

Col. 1, line 59, "elements" should be --element--.

Col. 4, line 15, "$V_f$" should be --$V_y$--.

Col. 5, line 35, "a" should be --$\underline{a}$--.

Col. 6, line 28, "a" should be --$\underline{a}$--.

Col. 6, line 33, in formula (16) "$F^o$" should be --$F_o$--.

Signed and Sealed this

Nineteenth Day of May 1981

[SEAL]

Attest:

RENE D. TEGTMEYER

*Attesting Officer*   *Acting Commissioner of Patents and Trademarks*